United States Patent [19]
Parise

[11] Patent Number: 6,057,050
[45] Date of Patent: *May 2, 2000

[54] QUICK CHARGE BATTERY WITH THERMAL MANAGEMENT

[76] Inventor: Ronald J. Parise, 101 Wendover Rd., Suffield, Conn. 06078

[*] Notice: This patent is subject to a terminal disclaimer.

[21] Appl. No.: 09/183,359

[22] Filed: Oct. 30, 1998

Related U.S. Application Data

[63] Continuation-in-part of application No. 08/933,664, Sep. 17, 1997, Pat. No. 5,871,859
[60] Provisional application No. 60/046,027, May 9, 1997.

[51] Int. Cl.⁷ .......................... H01M 14/00; H01M 10/44
[52] U.S. Cl. .................................. 429/7; 429/26; 429/62; 429/120; 320/2; 320/35
[58] Field of Search ............................ 429/7, 8, 61, 62, 429/90, 91, 120, 26; 320/2, 35, 48

[56] References Cited

U.S. PATENT DOCUMENTS

| | | | |
|---|---|---|---|
| 4,007,315 | 2/1977 | Brinkman et al. | 429/62 |
| 5,121,047 | 6/1992 | Goodken et al. | 320/39 |
| 5,480,734 | 1/1996 | Schulz et al. | 429/7 |
| 5,569,552 | 10/1996 | Rao et al. | 429/72 |
| 5,599,636 | 2/1997 | Braun | 429/7 |
| 5,623,195 | 4/1997 | Bullock et al. | 320/22 |
| 5,645,949 | 7/1997 | Young | 429/7 |
| 5,689,173 | 11/1997 | Oosaki et al. | 320/35 |
| 5,871,859 | 2/1999 | Parise | 429/7 |

*Primary Examiner*—Maria Nuzzolillo
*Assistant Examiner*—Raymond Alejandro
*Attorney, Agent, or Firm*—Alix, Yale & Ristas, LLP

[57] ABSTRACT

A quick charge battery with thermal management is described which includes a thermoelectric generator disposed within the cells of the battery to supply thermal energy to the battery. The thermoelectric cell is capable of heating the battery to a minimum temperature level when current is supplied in a first direction and capable of cooling the battery when the current is supplied in a second direction. The thermoelectric cell functions to cool the cell and thereby minimizes thermal build-up produced by rapid charging of the battery.

23 Claims, 8 Drawing Sheets

QUICK CHARGE BATTERY WITH THERMAL MANAGEMENT

CROSS-REFERENCE TO RELATED APPLICATIONS

This application is a continuation in part of U.S. application Ser. No. 08/933,664 filed Sep. 17, 1997, now U.S. Pat. No. 5,871,859. U.S. application Ser. No. 08/933,664 claims the benefit of U.S. Provisional Application Serial No. 60/046,027 filed May 9, 1997.

BACKGROUND OF THE INVENTION

1. Field of the Invention

The present invention relates in general to a thermal management device for use with a battery. In particular the present invention relates a thermoelectric cooling and heating device disposed within the cells of a battery to effectively cool the battery during rapid charging as well as heat the battery during colder periods.

2. Prior Art

There have been numerous attempts and initiatives established for next generation land based vehicles. Some programs have set goals for vehicle mileage of 80 miles/gal and greatly reduced vehicle emissions based on today's standards. Federal and local governments have placed limits on emissions as well as standards for fuel consumption. Even with regenerative braking energy, a hybrid electric/internal combustion vehicle will be pressed to meet these goals.

Hybrid, All-Electric and internal combustion types of vehicles will need a means to store energy on board. For the present, the means of choice is lead-acid batteries, with the hybrid electric vehicle having auxiliary power supplied by a small internal combustion engine. The technology of lead-acid batteries is well known in the art and is therefore the battery of choice based upon economics, availability and reliability.

One of the main drawbacks to lead-acid batteries is internal heat buildup as a natural consequence of the discharge process as well as $I^2R$ losses during discharge and high rates of charging. This limits the recharging rate to the battery for an electric vehicle which has a limited range of about 80 miles. To become practical a quick turnaround on recharge is needed. One of the factors preventing this advancement is the heat build-up during quick recharge.

In a hybrid electric vehicle application the auxiliary power unit provides a continuous charge to the battery energy storage system. As such, heat generation in the lead-acid battery is a constant problem that must be addressed to reduce thermal damage to the batteries.

There are many patents that disclose various attempts aimed at cooling the battery during charging. U.S. Pat. No. 4,007,315 discloses liquid coolant tubes disposed in the electrolyte above the plates of the battery attempting to remove the heat generated in the battery. U.S. Pat. No. 5,569,552 discloses a double-walled battery in which to circulate liquid in an attempt to cool the battery. U.S. Pat. Nos. 5,623,195 and 5,121,047 disclose charging schemes which attempt to limit or reduce the effect of the thermal build-up in the cells during charging. Although these charging schemes are effective in lowering the thermal build-up in batteries during a charge they disadvantageously prolong the charging cycle.

None of the aforementioned prior art designs are aimed at the heart of the cell of a battery where the thermal energy is produced. What is needed is a thermal management device in batteries that will better manage the heat build-up in the hybrid electric vehicle as well as allowing for a much quicker charge in the all-electric vehicle, reducing the heating problem significantly in the battery energy storage units of these vehicles. It has been estimated that an average operating temperature of 10° C. higher shortens the lifetime of the battery by half. Therefore, it is of paramount importance that the temperature of the battery, and hence the amount of thermal energy that is produced in the battery, be managed accordingly.

SUMMARY OF THE INVENTION

The above discussed and other drawbacks and deficiencies of the prior art are overcome or alleviated by the quick charge battery with thermal management of the present invention.

The operation of the cooling system of the present invention utilizes thermoelectric cooling within the interior of the battery, as well as the exterior surfaces of the battery. The heat generated in the battery due to charging operations can be removed without creating problems in the operation of, while increasing the useful lifetime of, the battery. In addition, with the thermoelectric cooler disposed within the battery it is possible to reverse current flow through the thermoelectric generator, thereby heating the battery. The invention is therefore applicable to batteries of any type and in any usage where temperature control of the battery interior and exterior is desired.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several Figures.

DETAILED DESCRIPTION OF THE PREFERRED EMBODIMENTS

Figure 1:
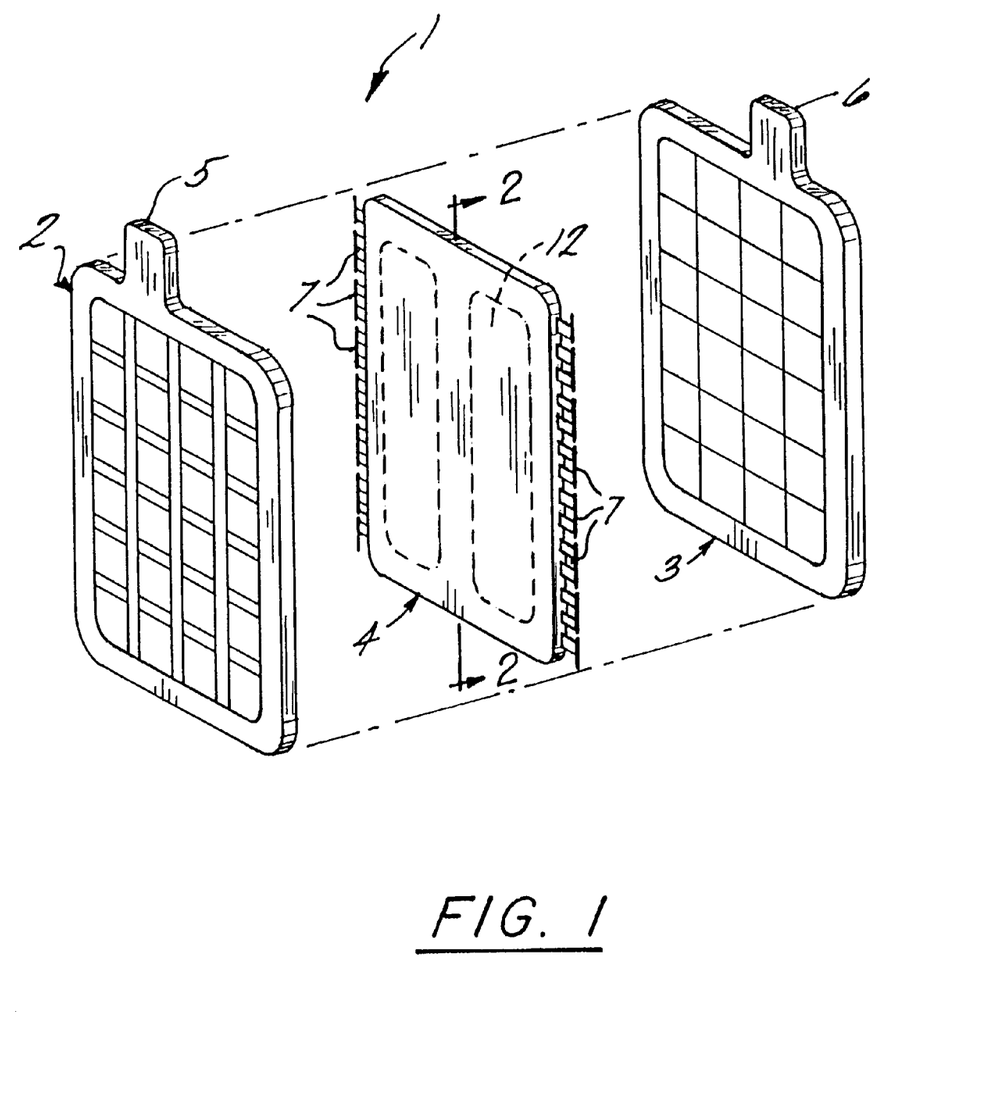
FIG. 1 is an exploded isometric view showing a partition incorporating the present invention.

Referring to FIG. 1 there is shown the basic two-plate system 1 of the present invention. The two plate system includes positive grid 2, negative grid 3, and partition 4. The positive grid includes positive terminal 5 and the negative grid includes negative terminal 6. The partition 4 is comprised of a microporous material and includes a thermoelectric generator of the present invention disposed therein. In an embodiment of the basic two plate system of the present invention microporous partition 4 is disposed within a battery casing (not shown) between positive grid 2 and negative grid 3 within an electrolytic solution (also not shown). The partition is comprised of microporous material to allow the free movement of ions between the two grids. Also shown in FIG. 1 are hot junction plates 7 of the thermoelectric generator.

Figure 2:
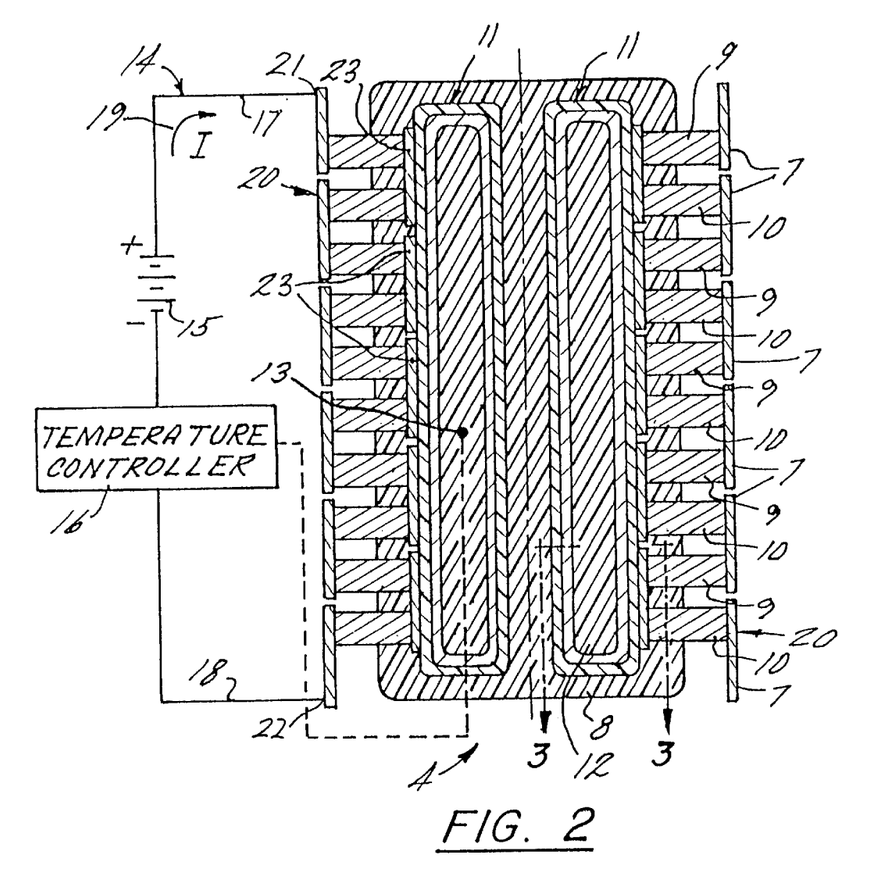
FIG. 2 is a schematic and sectional view taken along lines 2—2 of FIG. 1 showing the thermoelectric generator and temperature control circuit of the present invention.

Referring next to FIG. 2 there is shown a partial section view and schematic of the partition of the present invention as illustrated in FIG. 1. Partition 4 is comprised of microporous material 8, p-type semiconductor material 9, n-type semiconductor material 10, hot junction plates 7, cold plate 11, temperature sensor 13 mounted within slot 12, and temperature control circuit 14. Temperature control circuit 14 includes power source 15, temperature controller 16, and power leads 17, 18. In one embodiment of the present invention the temperature of a cell of the battery is determined by temperature sensor 13, either continuously or during a charging operation, and communicated to temperature controller 16. If the temperature within the cell is higher than a threshold temperature established within the controller, the power source sends a current 19 to thermoelectric generator 20 via power leads 17, 18 electrically connected to the thermoelectric generator at connections 21, 22. The current establishes a temperature difference between hot junction plate 7 and cold junction plate 23. With current 19 flowing in the direction shown in FIG. 2 the cold junction plates become lower in temperature than the hot junction plates. Cold junction plates 23 are disposed in a heat exchange relationship with cold plate 11 wherein the temperature of the cold plate is reduced. Microporous material 8 allows the electrolyte to pass through partition 4 where it comes into heat transfer contact with cold plate 11. The hot electrolyte is cooled by the cold plate, essentially a heat sink, until a lower threshold temperature is reached, at which time the temperature controller stops the current flow to the thermoelectric generator. The charging operation can continue at a rapid rate while the heat is transferred from the electrolyte to the cold plates. Although not shown in FIG. 2 temperature control circuit 14 also works to control thermoelectric generator 20 on the right hand side of the figure as shown.

Figure 3:
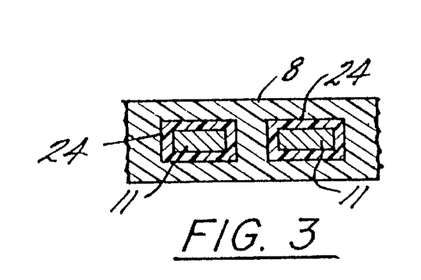
FIG. 3 is a sectional view taken along lines 3—3 in FIG. 2 showing a heat sink of the present invention.

The hot junction plates, cold junction plates and cold plates are advantageously comprised of a material with good heat transfer characteristics, such as exhibited by many metals. In addition, the hot junction plates and the cold junction plates are advantageously comprised of a material exhibiting good electrically conductive characteristics. The electrolyte within the battery is corrosive and as such the embodiment of the present invention depicted in FIG. 3 includes electrolyte resistant coating 24 encapsulating cold plate 11. Although not shown, the cold junction plates, the p-type material, the n-type material and the temperature sensor are all advantageously coated in a similar fashion to preclude attack of the component by the electrolyte. By way of example, commercially available ABS would be a suitable coating material.

Again with reference to FIG. 2 an embodiment of the present invention includes a battery which requires intermittent charging under various ambient temperature conditions. It is well known in the art that batteries operate most efficiently and reliably within a small band of temperatures. Likewise, if the ambient conditions surrounding the battery are too cold the internal resistance of a battery may be too high to allow the battery to operate efficiently. The battery in this particular embodiment would be electrically connected to a charging circuit as needed. If the temperature of a cell is higher than the predetermined threshold temperature the temperature controller would operate to cool the cell as described herein above. However if the temperature of the cell is perceived to be lower than a predetermined threshold temperature the temperature controller functions to raise the temperature of the cell. In this mode of operation temperature controller 16 operates to switch the direction of current 19 to be opposite of that depicted in FIG. 2. With the current flowing in the opposite direction, thermoelectric generator 20 functions in an opposite manner to that described herein above. Namely, hot junction plate 7 becomes the cold junction plate and cold junction plate 23 becomes the hot junction plate. Heat is transferred to the cold plate wherein it is then transferred to the electrolyte to effect a temperature increase within the cell of the battery. Current is supplied via the temperature controller until the cell reaches a suitable predetermined temperature when charging, or a more efficient use of the battery can then be commenced. It is contemplated that this particular embodiment would be useful in transportation vehicles having internal combustion engines exposed to low ambient temperatures.

In another embodiment of the present invention it is contemplated that the charging circuit is also controlled by temperature control circuit 14 wherein the charging operation of the battery would not commence, or could be interrupted, until certain threshold temperature conditions were established by either heating or cooling the battery. In still another embodiment of the present invention it is contemplated that the temperature of the battery would be continuously monitored and maintained within a predetermined temperature range in an effort to maintain the battery within an optimum efficiency range and to prolong the life of the battery.

Figure 4:
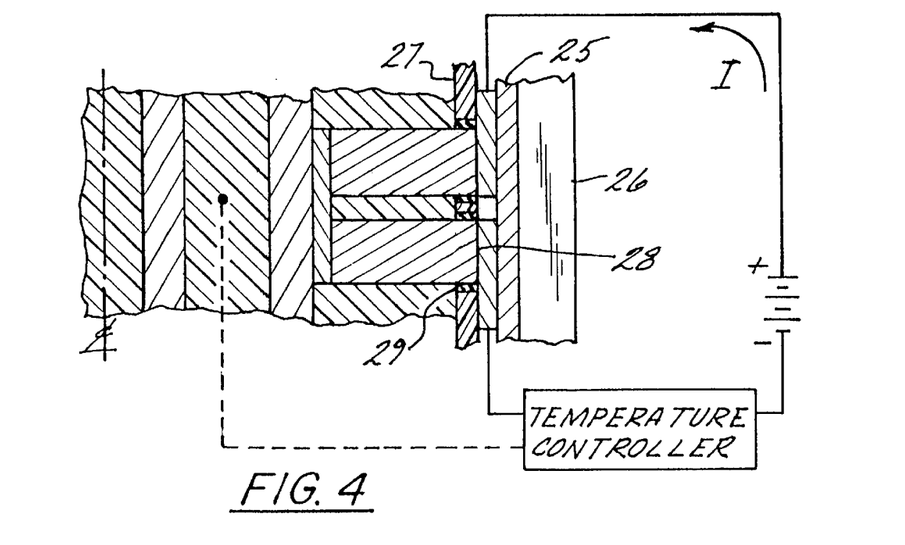
FIG. 4 is a partial schematic and partial sectional view showing the thermoelectric generator and temperature controlling circuit of the present invention.

Referring now to FIG. 4 there is shown one half-cell of cell partition 4 in an embodiment of the present invention. In addition to the embodiments described herein above there is included hot plate 25 disposed in contact with hot junction plate 7 and heat transfer fin 26. The hot plate and the heat transfer fin are positioned outside of battery case 27 and in heat transfer relationship with ambient air thereby increasing the heat transfer rate from the hot plate junction, the temperature difference between the hot plate junction and the cold plate junction, and ultimately increasing the efficiency of the thermoelectric generator. Cooling fin 26 could advantageously be placed in heat transfer relationship with air forced over the fin by a fan to increase the amount of heat transferred from the battery.

It is contemplated that an embodiment of the present invention would include only hot plate 25 without heat transfer fin 26 if additional heat transfer capability were not necessary. Also shown in FIG. 4 are openings 28 and seals 29 in battery case 27. The openings allow for the p-n materials to exit the battery case where they are connected to the hot junction plates. The seals work to retain the gases and electrolyte within the battery case. Also shown in FIG. 4 is the encapsulation of the elements of the present invention within microporous electrolyte absorbent material 8.

Figure 5:
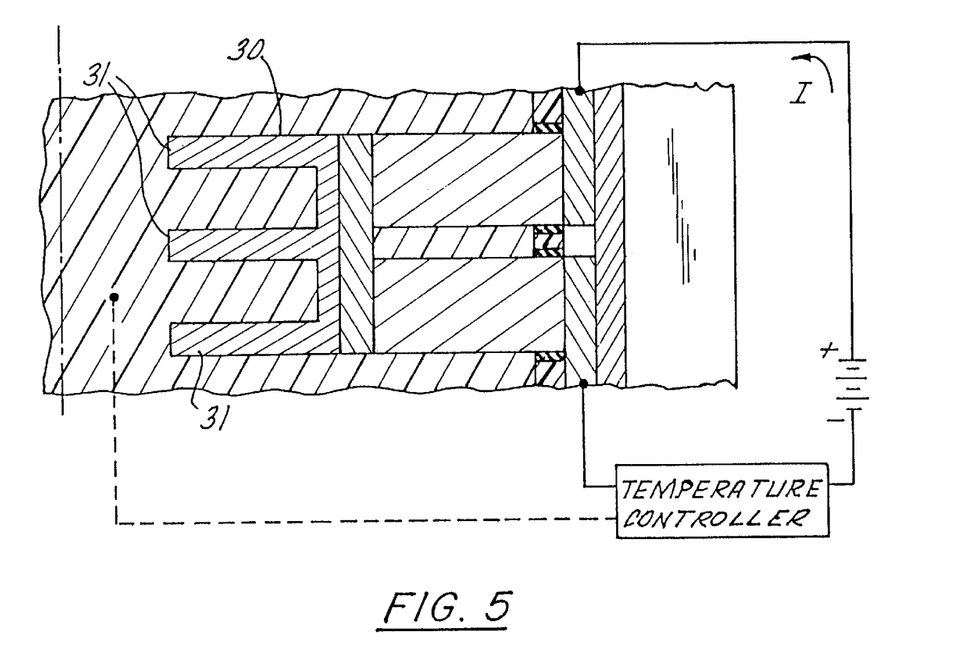
FIG. 5 is a partial schematic and partial sectional view showing the thermoelectric generator and temperature controlling circuit of the present invention.

Referring to FIG. 5 there is shown another embodiment of the cold plate 30 of the present invention. Cold plate 30 includes heat transfer fins 31 disposed within microporous material 8. The heat transfer fins increase the surface area in heat exchange relationship with the electrolyte and ultimately work to increase the overall heat transfer of the cold plate.

Figure 6:
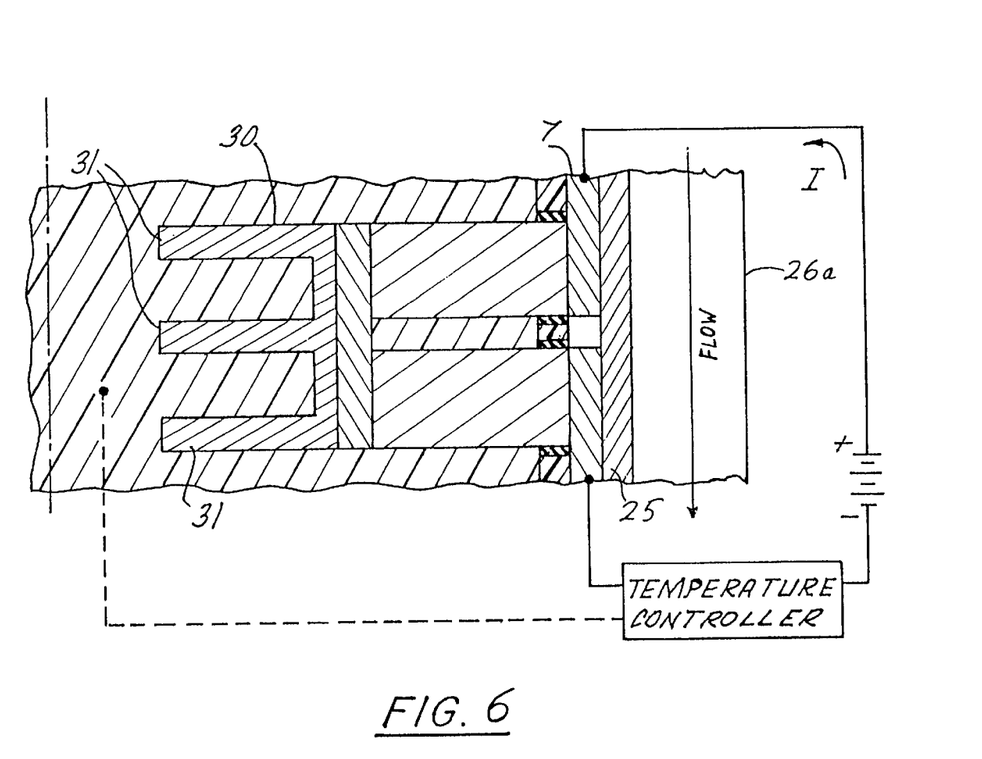
FIG. 6 is a partial schematic and partial sectional view similar to FIG. 5 showing cooling of the hot junction plate by a fluid heat exchanger.

Alternatively, as shown in FIG. 6, the hot plate 25 could be disposed in physical and thermal contact with a heat exchanger 26a Cooling fluid, such as water, flowing through the heat exchanger would transfer heat away from the hot plate to increase the amount of heat transferred from the battery. The configurations shown are by way of example and do not limit the many various configurations of a cold plate contemplated by the present invention.

Figure 7:
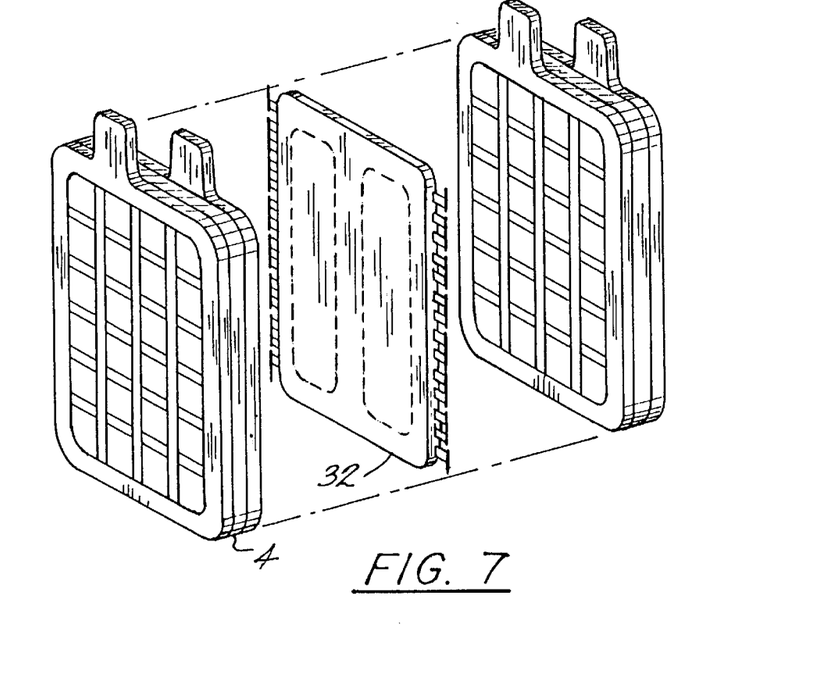
FIG. 7 is an exploded isometric view showing a cell separator incorporating the present invention.
Figures 8, 10:
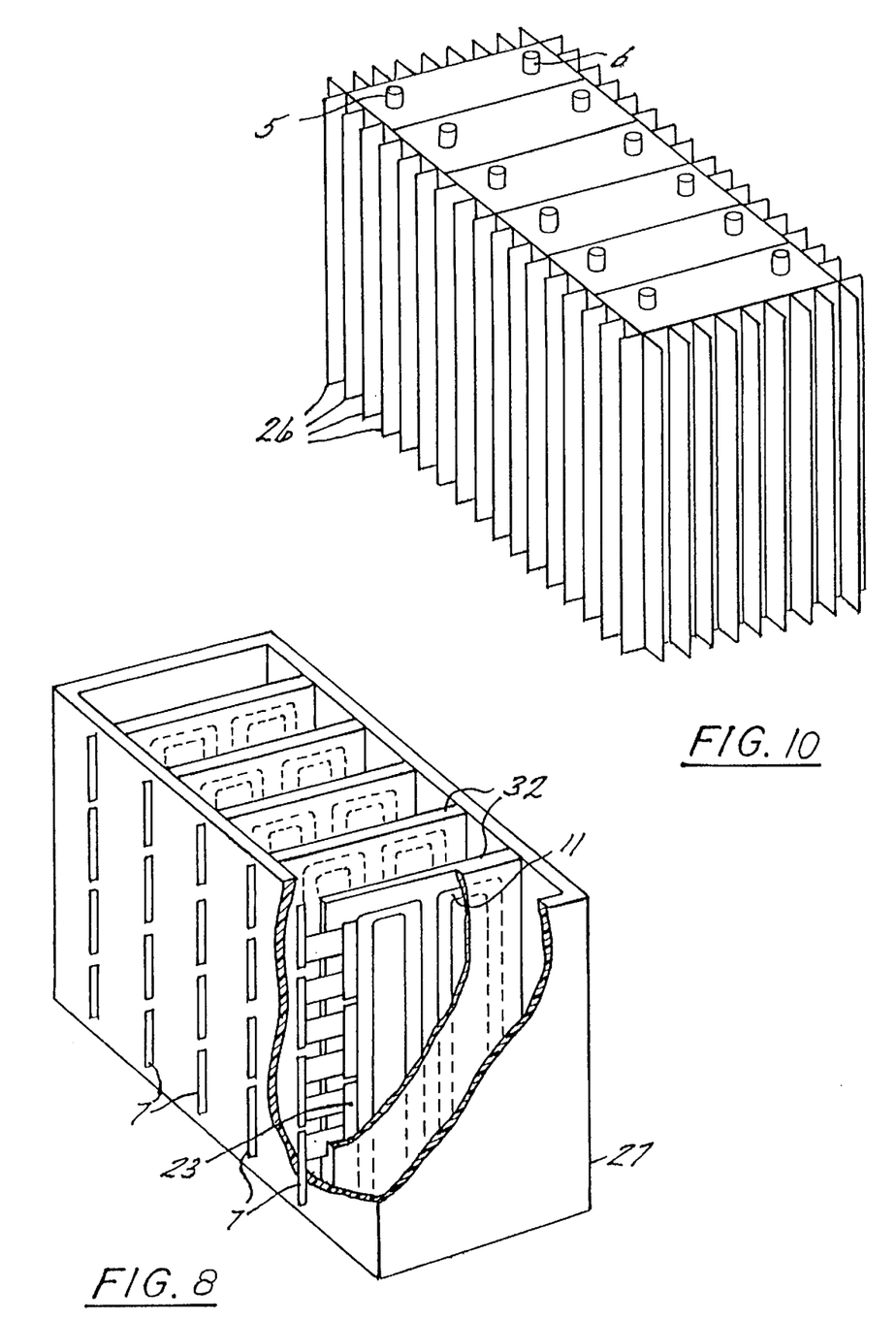
FIG. 8 is an isometric view of a battery case and partial sectional view of cell separators incorporating the present invention.
FIG. 10 is an isometric view of a battery showing external heat exchanger fins.

Referring to FIGS. 7 and 8 there is shown an embodiment of the present invention wherein the thermoelectric generator is disposed within cell separator 32. FIG. 7 illustrates positive plates 2 separated from negative plates 3 by partition 4. Each pair of positive and negative plates immersed in an electrolyte in ion exchange relationship defines a cell within a battery. The cells are separated from one another, with no ion exchange occurring between cells, by cell separator 32. FIG. 8 illustrates the placement of cell separators incorporating the thermoelectric generators of the present invention in battery case 27. Shown in the figure is a typical arrangement of a 12 volt lead-acid battery including five cell separators defining six cells. The cell separator illustrated in the foreground of the figure is shown in partial cross section in order to expose the detail of the thermoelectric generator. The cell separators are comprised of a non-porous material and contact battery case 27 in a gastight and fluid-tight connection to isolate each of the cells. An embodiment of this type, wherein the thermoelectric generators are disposed within the cell separators, functions similar to that of the embodiment where the thermoelectric generators are disposed in the aforementioned partitions. The basic difference is that the cell separators are non-porous and therefore there is no direct heat transfer between the cold plates and the electrolyte. The heat transfer occurs due to conduction heat transfer between the electrolyte and the cell separator material and then in turn between the cold plates and the non-porous cell separator material. An embodiment is contemplated where thermoelectric generators would be disposed only in a few of the cell separators when additional cooling capacity is not required.

Figure 9:
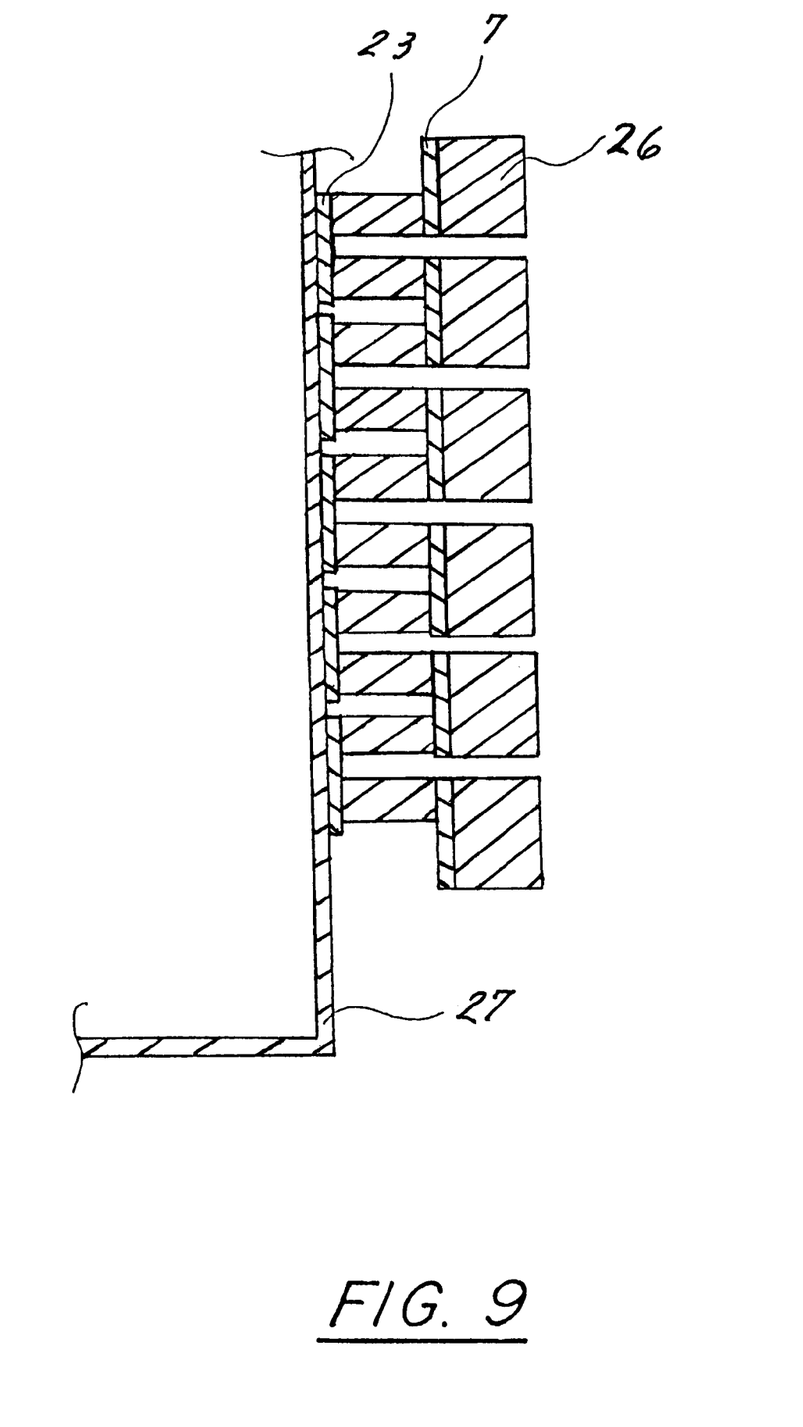
FIG. 9 is a schematic view of a battery incorporating an embodiment of the invention using cooling of the external battery case

Another embodiment, shown in FIG. 9, is possible where the thermoelectric generator is outside of the battery, with the cold junction plates 23 in a heat exchange relationship with the exterior of the battery case 27. In this embodiment the hot junction plates 7 are also external to the battery, and may be in a heat exchange relationship with a transfer fin 26 for air cooling or a heat exchanger (not shown) for liquid cooling. In practice, the thermoelectric generator could be sandwiched between two protective layers of, for example Mylar, with one protective layer attached to the battery case and the cold junction plate in thermal contact with the case through that layer. The hot junction plate would be in thermal contact with the opposite layer, and transfer heat therethrough to a fin or other heat exchanger.

Although not shown in the figures, an embodiment of the present invention is contemplated where the thermoelectric generator is disposed within the wall of the battery case in much the same manner as the embodiment disposed within the cell separator. There is also contemplated an embodiment of the present invention including a combination of thermoelectric generators disposed in some or all of the cell separators, partitions, walls and exterior of the battery case. Referring to FIG. 10 there is shown such an embodiment of a battery 33 including external heat transfer fins 26. In other certain embodiments external heat transfer fins 26 would be located externally consistent with the internal placement of thermoelectric generators.

Also illustrated in FIG. 10 are separate positive terminals 5 and negative terminals 6. In this particular embodiment the charging operation is carried out on a cell-by-cell basis. Each cell includes a temperature sensing device and a temperature control circuit. The temperature of each cell is separately controlled as it is charged so that no one cell is outside of the predetermined temperature limits and such that no cell is undercharged or overcharged.

Figure 11:
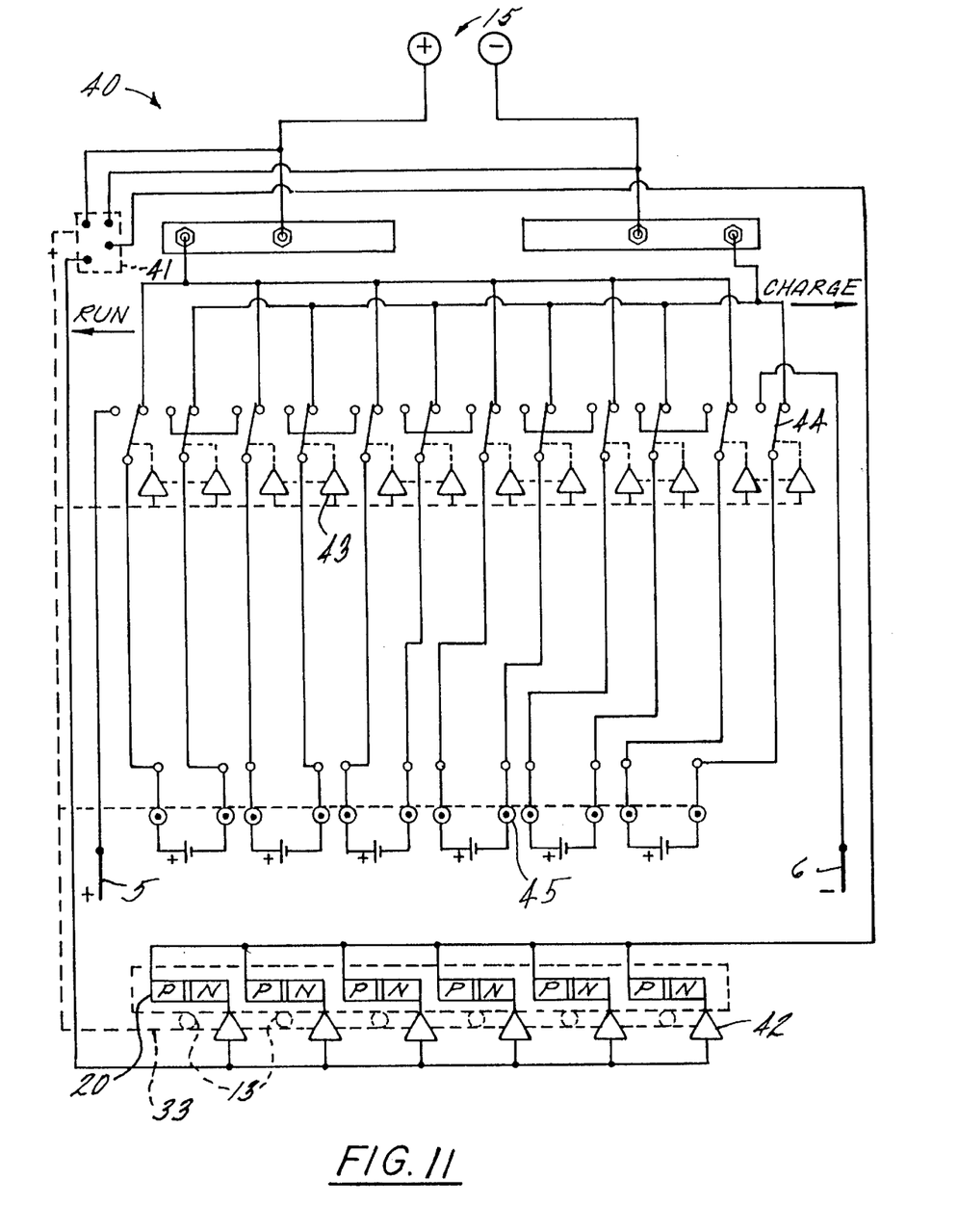
FIG. 11 is a schematic diagram showing a battery incorporating the charging and temperature control system of the present invention.

Referring now to FIG. 11 there is shown a schematic diagram of an embodiment of quick charging battery system 40 of the present invention. The quick charging battery system includes battery charge and temperature controller 41, thermoelectric generator controller 42, battery contact controller 43, switch 44, and battery charge sensors 45. The circuit illustrated shows battery contact controllers 43 with switches 44 in the charge position. In operation, battery charge sensors monitor the voltage of the battery and transmit a signal to battery charge and temperature controller 41. When the voltage reaches a predetermined low threshold the battery charge and temperature controller check the temperature of each cell and transmits power to each of the thermoelectric generator controllers to adjust the temperature of the cell within predetermined limits. Once the battery reaches a temperature within the acceptable range the contact controllers position the switches in the charge position and charging current is carried to the individual cells from power source 15. The temperature of the battery is maintained within limits during the charging operation. The charge sensors monitor the voltage levels within each cell and when the level of charge reaches a predetermined level the charge and temperature controller transmits a signal to the battery contact controller for that individual cell to reposition the switch in the opposite, run, position. If, during the charging of an individual cell, the temperature increase is too high the battery charge and the temperature controller stops charging that individual cell until the thermoelectric generator is capable of lowering its temperature sufficiently. The sequence of monitoring charge and temperature and supplying a current to the charging network and to the thermoelectric generators continues on an ongoing basis until the system is turned off. An embodiment of the present invention is also contemplated wherein the charging network is operable to charge the battery while the battery is simultaneously in electrical contact with a load.

The quick charge battery system of the present invention is advantageously used in the internal combustion engine vehicles of today in order to prolong battery life. Currently the lead-acid batteries used in automobiles are constantly being charged by the alternator and are therefore continuously being subjected to high temperatures from both the inherent process of being recharged and the hot ambient environment. An embodiment of the present invention includes a scheme whereby energy that is supplied by the alternator is used to continuously cool the battery. On extremely cold days, the battery can be brought up to operating temperature quickly by the thermoelectric generator, then cooled or heated as needed.

Thermal management of the battery either during charging or during usage is not unique to lead-acid batteries and the present invention is not limited to usage therein. The problem of heat build-up is encountered in many electrochemical batteries. Therefore the utilization of the thermoelectric heater/cooler in the cell partitions or battery walls to better control the operating temperature of the battery is also a great enhancement to the state of the art of battery thermal management. This would include the use of the thermal management system in battery charges where the external wall of the individual battery cells becomes hot from charging.

The thermal management system of the present invention can also be applied to fuel cell batteries. For example, in an $H_2/O_2$ fuel cell, dehydration of cell membranes due to heat generation from the electrochemical reactions takes place. This dehydration causes cell performance to deteriorate. But utilization of the thermoelectric cooler and thermal management system in the construction of the fuel cell battery can control the heat generation in the cell and hence improve cell performance and extend the fuel cell life.

The drawings of the thermoelectric generator show the basic p-material and n-material junctions that are used for the device. However, the state of the art is such that variations of the basic p-n junctions can include cascading or staging of the generators to improve the efficiency and the effectiveness of the thermal energy that is available. This would also include staging the p-material and the n-material to improve the overall figure of merit.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A thermal management device for varying the temperature of a battery, the battery having an exterior and a case containing an electrolyte solution and capable of producing an electrical potential, the thermal management device comprising:
    a heat sink disposed within the case;
    a thermoelectric generator disposed within the case comprised of a plurality of alternating p-type semiconductor materials and n-type semiconductor materials having gaps therebetween, the p-type and n-type semiconductor materials having a first end and a second end disposed in electrical contact with a plurality of first junction surfaces on the first end and in electrical contact with a plurality of second junction surfaces on the second end, the first junction surfaces in heat exchange relationship with the heat sink, the second junction surfaces in heat exchange relationship with the exterior of the battery; and
    a power source in electrical contact with the thermoelectric generator operable to supply current to the thermoelectric generator such that a temperature difference is produced between the first junction surfaces and the second junction surfaces.

2. The thermal management device as set forth in claim 1 further comprising a heat transfer device in heat exchange relationship with the second junction surfaces.

3. The thermal management device as set forth in claim 2 wherein the heat transfer device is also in heat exchange relationship with air.

4. The thermal management device as set forth in claim 2 wherein the heat transfer device is also in heat exchange relationship with a liquid.

5. A thermal management device for varying the temperature of a battery, the battery having an exterior and a case containing an electrolyte solution and producing an electrical potential, the thermal management device comprising:
    a thermoelectric generator disposed on the battery exterior comprised of a plurality of alternating p-type semiconductor materials and n-type semiconductor materials having gaps therebetween, the p-type and n-type semiconductor materials having a first end and a second end disposed in electrical contact with a plurality of first junction surfaces on the first end and in electrical contact with a plurality of second junction surfaces on the second end, the first junction surfaces in heat exchange relationship with the battery exterior, the second surfaces junction in heat exchange relationship with a heat exchanger; and
    a power source in electrical contact with the thermoelectric generator operable to supply current to the thermoelectric generator such that a temperature difference is produced between the first junction surfaces and the second junction surfaces.

6. The thermal management device set forth in claim 5, further comprising:
    a temperature controller;
    a temperature sensor disposed within the case capable of determining the perceived temperature of the electrolyte and operably connected to the temperature controller for sending a signal to the temperature controller;
    the temperature controller capable of comparing the perceived temperature of the electrolyte to a predetermined temperature range; and
    the temperature controller operably connected to the power source and capable of controlling the supply of current to the thermoelectric generator such that the temperature of the electrolyte is maintained within the predetermined range.

7. The thermal management device set forth in claim 5 further including means for removing heat from the heat exchanger.

8. A thermal management device for varying the temperature of a battery, the battery having an exterior, at least one positive plate, at least one negative plate, at least one microporous partition, the partition positioned between the positive and negative plates and disposed within a case containing an electrolyte solution and producing an electrical potential, the thermal management device comprising:
    a heat sink disposed within the partition in heat exchange relationship with the electrolyte;
    a thermoelectric generator partially disposed within the partition comprised of a plurality of alternating p-type semiconductor materials and n-type semiconductor materials having gaps therebetween, the p-type and n-type semiconductor materials having a first end and a second end disposed in electrical contact with a plurality of first junction surfaces on the first end and in electrical contact with a plurality of second junction surfaces on the second end, the first junction surfaces in heat exchange relationship with the heat sink, the second surfaces junction surfaces in heat exchange relationship with the exterior of the battery; and
    a power source in electrical contact with the thermoelectric generator operable to supply current to the thermoelectric generator such that a temperature difference is produced between the first junction surfaces and the second junction surfaces.

9. The thermal management device set forth in claim 8, wherein the current is supplied in a first direction such that the first junction surface is at a lower temperature than the second junction surface thereby cooling the battery.

10. The thermal management device set forth in claim 8, wherein the current is supplied in a second direction such that the first junction surface is at a higher temperature than the second junction surface thereby heating the battery.

11. The thermal management device set forth in claim 8, further comprising:
   a temperature controller;
   a temperature sensor disposed within the partition capable of determining the perceived temperature of the electrolyte and operably connected to the temperature controller for sending a signal to the temperature controller;
   the temperature controller capable of comparing the perceived temperature of the electrolyte to a predetermined temperature range; and
   the temperature controller operably connected to the power source and capable of controlling the supply of current to the thermoelectric generator such that the temperature of the electrolyte is maintained within the predetermined range.

12. The thermal management device as set forth in claim 8 wherein the heat sink and the thermoelectric generator are coated with a electrolyte resistant material.

13. The thermal management device as set forth in claim 8 wherein the heat sink is comprised of a heat exchanger having a plurality of fins.

14. The thermal management device as set forth in claim 8 further comprising a heat exchanger fixedly attached to and in heat exchange relationship with the second junction surfaces.

15. A thermal management device for varying the temperature of a battery, the battery having an exterior, at least two positive-negative plate pairs each defining a cell, a microporous partition disposed between each of the negative-positive plate pairs, at least one non-porous cell separator, the cell separator positioned between the positive-negative plate pairs and disposed within a case containing an electrolyte solution and producing an electrical potential, the thermal management device comprising:
   a heat sink disposed within at least one cell separator, the cell separator in heat exchange relationship with the electrolyte;
   a thermoelectric generator partially disposed within at least one cell separator comprised of a plurality of alternating p-type semiconductor materials and n-type semiconductor materials having gaps therebetween, the p-type and n-type semiconductor materials having a first end and a second end disposed in electrical contact with a plurality of first junction surfaces on the first end and in electrical contact with a plurality of second junction surfaces on the second end, the first junction surfaces in heat exchange relationship with the heat sink, the second junction surfaces in heat exchange relationship with the exterior of the battery; and
   a power source in electrical contact with the thermoelectric generator operable to supply current to the thermoelectric generator such that a temperature difference is produced between the first junction surfaces and the second junction surfaces.

16. The thermal management device set forth in claim 15, wherein the current is supplied in a first direction such that the first junction surface is at a lower temperature than the second junction surface thereby cooling the battery.

17. The thermal management device set forth in claim 15, wherein the current is supplied in a second direction such that the first junction surface is at a higher temperature than the second junction surface thereby heating the battery.

18. The thermal management device set forth in claim 15, further comprising:
   a temperature controller;
   a temperature sensor disposed within the cell separator capable of determining the perceived temperature of the electrolyte and operably connected to the temperature controller for sending a signal to the temperature controller;
   the temperature controller capable of comparing the perceived temperature of the electrolyte to a predetermined temperature range; and
   the temperature controller operably connected to the power source and capable of controlling the supply of current to the thermoelectric generator such that the temperature of the electrolyte is maintained within the predetermined range.

19. The thermal management device as set forth in claim 15 wherein the heat sink is comprised of a heat exchanger having a plurality of fins.

20. The thermal management device as set forth in claim 15 further comprising a heat exchanger fixedly attached to and in heat exchange relationship with the second junction surfaces.

21. The thermal management device as set forth in claim 15 further comprising:
   a thermoelectric generator disposed within at least one of the partitions and the battery case, each thermoelectric generator comprised of a plurality of alternating p-type semiconductor materials and n-type semiconductor materials having gaps therebetween, the p-type and n-type semiconductor materials having a first end and a second end disposed in electrical contact with a plurality of first junction surfaces on the first end and in electrical contact with a plurality of second junction surfaces on the second end, the second junction surfaces in heat exchange relationship with the exterior of the battery;
   a heat first sink disposed within at least one partition in heat exchange relationship with the first junction surfaces and the electrolyte; and
   a heat second sink disposed within the case in heat exchange relationship with the first junction surfaces;
   wherein the cell separator and case are in heat exchange relationship with the electrolyte.

22. A thermal management device for varying the temperature of a fuel cell, the fuel cell having an exterior and a case containing fuel and oxidation materials and capable of producing energy, the thermal management device comprising:
   at least one heat sink disposed within the case;
   at least one thermoelectric generator disposed within the case, each comprised of a plurality of alternating p-type semiconductor materials and n-type semiconductor materials having gaps therebetween, the p-type and n-type semiconductor materials having a first end and a second end disposed in electrical contact with a plurality of first junction surfaces on the first end and in electrical contact with a plurality of second junction surfaces on the second end, the first junction surfaces in heat exchange relationship with the heat sink, the second junction surfaces in heat exchange relationship with the exterior of the battery; and
   a power source in electrical contact with each thermoelectric generator operable to supply current to each thermoelectric generator such that a temperature difference is produced between the first junction surfaces and the second junction surfaces.

23. A thermal management device for varying the temperature of a battery, the battery having an exterior, at least two positive-negative plate pairs each defining a cell, a microporous partition disposed between each of the negative-positive plate pairs, at least one non-porous cell separator, the cell separator positioned between the positive-negative plate pairs and disposed within a case containing an electrolyte solution and producing an electrical potential, the thermal management device comprising:

a thermoelectric generator disposed within at least one of the partitions, at least one of the cell separators, and the battery case, each thermoelectric generator comprised of a plurality of alternating p-type semiconductor materials and n-type semiconductor materials having gaps therebetween, the p-type and n-type semiconductor materials having a first end and a second end disposed in electrical contact with a plurality of first junction surfaces on the first end and in electrical contact with a plurality of second junction surfaces on the second end, the second junction surfaces in heat exchange relationship with the exterior of the battery;

a heat sink disposed within at least one cell separator in heat exchange relationship with the first junction surfaces of the thermoelectric generator disposed in the cell separator;

a heat sink disposed within at least one partition in heat exchange relationship with the first junction surfaces of the thermoelectric generator disposed in the partition and the electrolyte;

a heat sink disposed within the case in heat exchange relationship with the first junction surfaces of the thermoelectric generator disposed in the case;

the cell separator and case in heat exchange relationship with the electrolyte; and a power source in electrical contact with each thermoelectric generator operable to supply current to each thermoelectric generator such that a temperature difference is produced between the first junction surfaces and the second junction surfaces.

* * * * *

UNITED STATES PATENT AND TRADEMARK OFFICE
CERTIFICATE OF CORRECTION

PATENT NO. : 6,057,050  
DATED : May 2, 2000  
INVENTOR(S) : Parise

Page 1 of 1

It is certified that error appears in the above-identified patent and that said Letters Patent is hereby corrected as shown below:

Column 10,  
Line 41, after "heat" delete "first" and insert -- first -- before "heat".  
Line 44, after "heat" delete "second" and insert -- second -- before "heat".

Signed and Sealed this

Thirteenth Day of December, 2005

JON W. DUDAS  
*Director of the United States Patent and Trademark Office*